United States Patent
Hansen et al.

(10) Patent No.: US 7,279,965 B2
(45) Date of Patent: Oct. 9, 2007

(54) REDUCTION OF AUDIBLE ARTIFACTS IN AN AUDIO SYSTEM

(76) Inventors: Thomas Holm Hansen, Åkandevej 46, Vaerløse, 3500 (DK); Lars Risbo, Østerbrogade 152, 4th, Copenhagen Ø, 2100 (DK); Anker Bjørn-Josefsen, Mødekaergårdsvej 16, Lynge, 3540 (DK)

( * ) Notice: Subject to any disclaimer, the term of this patent is extended or adjusted under 35 U.S.C. 154(b) by 143 days.

(21) Appl. No.: 11/150,952

(22) Filed: Jun. 13, 2005

(65) Prior Publication Data

US 2006/0279354 A1    Dec. 14, 2006

(51) Int. Cl.
*H03F 3/38*    (2006.01)
(52) U.S. Cl. .......................... 330/10; 330/251
(58) Field of Classification Search ................ 330/10, 330/207 A, 251
See application file for complete search history.

(56) References Cited

U.S. PATENT DOCUMENTS 6,788,137 B2 * 9/2004 Morita .................... 330/10
6,812,785 B2 * 11/2004 Masuda et al. .............. 330/10

OTHER PUBLICATIONS

Apogee Technology, Inc., "Applying the DDX-8000 in Binary Mode", (date unknown), pp. 1-16.
"STA500, 30V 3.5A Quad Power Half Bridge", Jul. 2003, ST Micro electronics, pp. 1-10.
"CS4360 24-Bit, 192 kHz 6-channel D/A Converter", http://www.cirrus.com, Jul. 2004, Cirrus Logic, Inc. pp. 1-37.

\* cited by examiner

*Primary Examiner*—Khanh Van Nguyen

(57) ABSTRACT

An audio system includes a switch mode amplifier that provides an output signal at an output for driving a load based on at least one control signal. A control system provides the at least one control signal to control the amplifier according to an operating mode of the audio system. In a first mode, the control system providing the at least one control signal to actively control an equivalent output impedance at the output of the amplifier, gradually adjusting the equivalent output impedance from a high-impedance state to a low impedance state, so as to mitigate a voltage drop across the load (e.g., including one or more speakers) when the amplifier is activated to a second mode corresponding to the low impedance state.

20 Claims, 4 Drawing Sheets

REDUCTION OF AUDIBLE ARTIFACTS IN AN AUDIO SYSTEM

TECHNICAL FIELD

The present invention relates to electronic circuits, and more specifically, to a system and method for reducing audible artifacts in an audio system.

BACKGROUND

Transient signals in an electrical circuit can cause a number of problems in certain applications. Transient signals that have sufficiently high voltage or current can damage electrical circuitry or otherwise adversely affect performance of one or more components. A transient voltage is usually the result of a sudden, sharp change in voltage across a circuit component that is often is associated with initiating power to a load. In some applications, transient signals may not damage components, but nonetheless provide undesirable effects and/or reduce performance.

In a number of applications, particularly relating to audio systems, it is desirable to eliminate or substantially reduce transient voltages across certain loads to reduce adverse impacts of such transient voltage on performance. Click/pop is one such undesirable result of transient voltages. Click/pop is an unpleasant audible artifact provided by a loudspeaker (or speaker), which is often heard when an audio system powers up or powers down. Click/pop is generally caused by a transient voltage drop (e.g., a DC offset mismatch) across a speaker that may occur when a power amplifier transitions between a non-switching mode and a switching mode.

The audibility of click/pop does not depend only on the energy involved, but also on how the energy spectrum is shaped. While click/pop is most often heard when the audio amplifier system is powered on, click/pop can also occur when the audio system is powered down, or when the audio system changes mode. The mode changes can include changing from surround mode to stereo mode, from stereo to mono mode or between different surround sound modes.

SUMMARY

The present invention relates generally to a system and method for reducing audible artifacts in an audio system. One aspect of the present invention provides an audio system that includes a switch mode amplifier that provides an output signal at an output for driving a load based on at least one control signal. A control system provides the at least one control signal to control the amplifier according to an operating mode of the audio system. In a first mode, the control system providing the at least one control signal to actively control an equivalent output impedance at the output of the amplifier, gradually adjusting the equivalent output impedance from a high-impedance state to a low impedance state, so as to mitigate a voltage drop across the load (e.g., including one or more speakers) when the power amplifier is activated to a second mode corresponding to the low impedance state. For example, the first mode may correspond to a start-up mode and the second mode may correspond to a normal mode. The amplifier is not required to end the first mode in any particular state (e.g., high impedance or low impedance) as long as the substantially correct voltage is provided at the end of the first mode. Thus, the reduction a voltage drop across the load operates to mitigate audible artifacts (e.g., click/pop) in the audio system.

Another aspect of the present invention provides a modulation system for an audio amplifier. The modulation system includes means for providing at least one modulated signal to provide audio power to at least one speaker. The modulation system also includes means for controlling the means for providing in a first mode such that the at least one modulated signal has a modulation that varies incrementally between a starting modulation and an ending modulation according to a modulation sequence. The modulation system further includes means for controlling the means for providing in a second mode, following the first mode, such that, in the absence of audio the at least one modulated signal has a substantially fixed modulation. As a result, whereby audible artifacts provided by the at least one speaker can be mitigated when the second mode begins.

Yet another aspect of the present invention provides a method for controlling an audio amplifier to mitigate audible artifacts. The method includes entering a first modulation mode in response to detecting a transition from a non-switching mode to a switching mode. Modulation of at least one modulated control signal is incrementally adjusted during the first modulation mode and an output signal is provided that gradually charges a DC blocking element to a predetermined level during the first modulation mode based on the at least one modulated control signal.

The systems and methods can use the same circuitry for generating the gradually increasing ramp signal (e.g., at start-up) as is used to provide the modulated output during normal operation. In addition to this affording a reduction in cost, this also mitigates the problem of matching that would exist if different circuitry were utilized for charging and for circuitry for normal operation.

DETAILED DESCRIPTION

The present invention relates to mitigating audible artifacts (e.g., click/pop) associated with energizing a load. The click/pop is mitigated by reducing a voltage mismatch that appears across a speaker, such when the audio system changes modes (e.g., during system power up or power down). The reduction of the voltage drop across the speaker is accomplished by controlling the equivalent output impedance of the output stage so as to provide for a gradual charging (e.g., ramping up) of one or more associated filter components. As a result of implementing the gradual charging, there is no (or very little) DC offset across the speaker when the mode change occurs, and, hence, no audible artifacts from the speaker.

Figure 1:
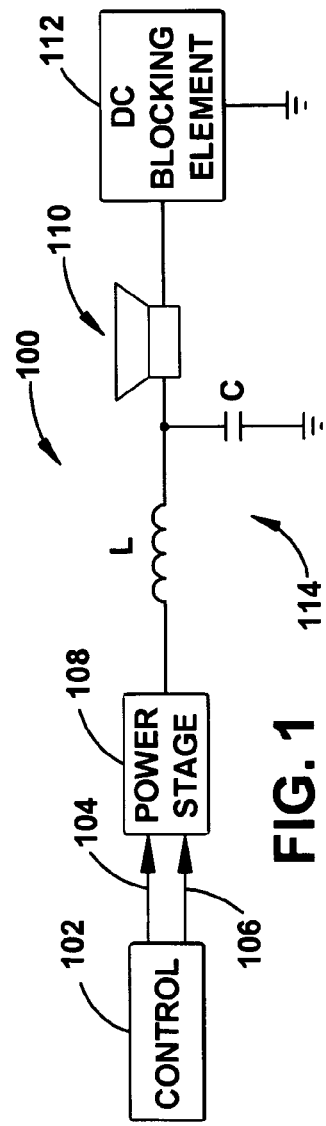
FIG. 1 illustrates an example of an audio system in accordance with an aspect of the invention.

FIG. 1 illustrates an audio system 100 that can be implemented according to an aspect of the present invention. The audio system 100 includes a control system 102 that supplies one or more control signals 104 and 106 to a power stage 108. The power stage 106 supplies an amplified output signal for driving an associated load 110 based on the one or more control signals. The power stage 108 may be, for example, a class D (or switch mode) amplifier that supplies a pulse-width modulated output signal. Other classes of amplifiers can also be employed. The control system 102 can be implemented as including a microcontroller, a digital signal processor or a state machine that is configured to control the amplifiers, such as described herein.

One or more filter components, namely, a DC blocking element 110, is connected in series with the load 110. The DC blocking element 110 may be implemented, for example, as a split capacitor (two capacitors connected in series between ground and the power supply voltage), a single capacitor, or a resistor network. The load 110 for an audio application corresponds to a resistive load, namely one or more speakers.

The control system 102 provides the control signals 104 and 106 to control an equivalent output impedance of the power stage 108. Since the power stage 108 can be implemented as a switch mode amplifier, the control system 102 can control the power stage to operate in a high impedance (High-Z) state in which power switch devices are deactivated as well as a low impedance state in which one of the power switch devices is activated to a conductive state. According to an aspect of the present invention, the control system 102 can also operate the power stage in an intermediate impedance (Mid-Z) mode in which low impedance and high impedance conditions are actively controlled during a Mid-Z sequence. By controlling the equivalent output impedance of the power stage 108, there can be a gradual charging (e.g., ramping up) of associated filter components, depicted in FIG. 1 as including a DC blocking element 112. As a result of implementing such gradual charging, there is no (or very little) DC offset across the load 110 when the mode change occurs. Thus, in the audio system 100 where the load 110 comprises a speaker, the reduction in DC offset across the load mitigates audible artifacts (e.g., click/pop), such as when the power stage 108 is activated to provide power to the speaker.

As an example, the Mid-Z sequence, for example, can begin with a short high pulse of duration w, followed by a period of time (T-w) in which the system is in the high-Z mode. After this period, a low pulse of duration w is applied followed by a period of time (T-w) in which the system is in the high-Z mode. The value of w can be actively controlled during the Mid-Z mode, as described herein, to slowly charge up the DC blocking element 112 without generating audible transients. The time period for implementing the Mid-Z sequence can correspond to a predetermined time period (e.g., approximately 0.1-5 seconds). Alternatively, the duration of the Mid-Z sequence can vary according to the amount of time required for charging the node 114 to a predetermined voltage (e.g., the idle amplifier output voltage during normal operation, such as one-half a positive power supply input voltage (PVDD/2)) without introducing additional audible artifacts. Thus, for the example of FIG. 1, the duration may vary depending on the aggregate impedance of the output being driven by the power stage 108, including the load 110, the filter 114 and the DC blocking element 112.

In the example of FIG. 1, a filter 114 is connected between the power stage 108 and the load 110. The filter 114 is depicted as including an inductor L and a capacitor C. The filter, for example, can be implemented to provide a second order low-pass filter that can remove high-frequency noise (e.g., switching noise). The filter 114 further may include series resistance from the inductor L as well as parasitic capacitance associated with the power stage (both not shown for sake of simplicity).

The control system 102 may include programmable features that allow a user to select one or more operating parameters associated with the Mid-Z sequence. For instance, the incremental variations in pulse width implemented during the Mid-Z sequence may be programmable. Additionally or alternatively, the system 100 can be programmed to control what types of mode changes would require use of the Mid-Z mode, such as including power-up of the system 100 as well as when switching between a non-switching mode to a switching mode for the power stage 108. The Mid-Z mode may also be enabled and disabled, such as by setting predefined configuration data.

Figure 2:
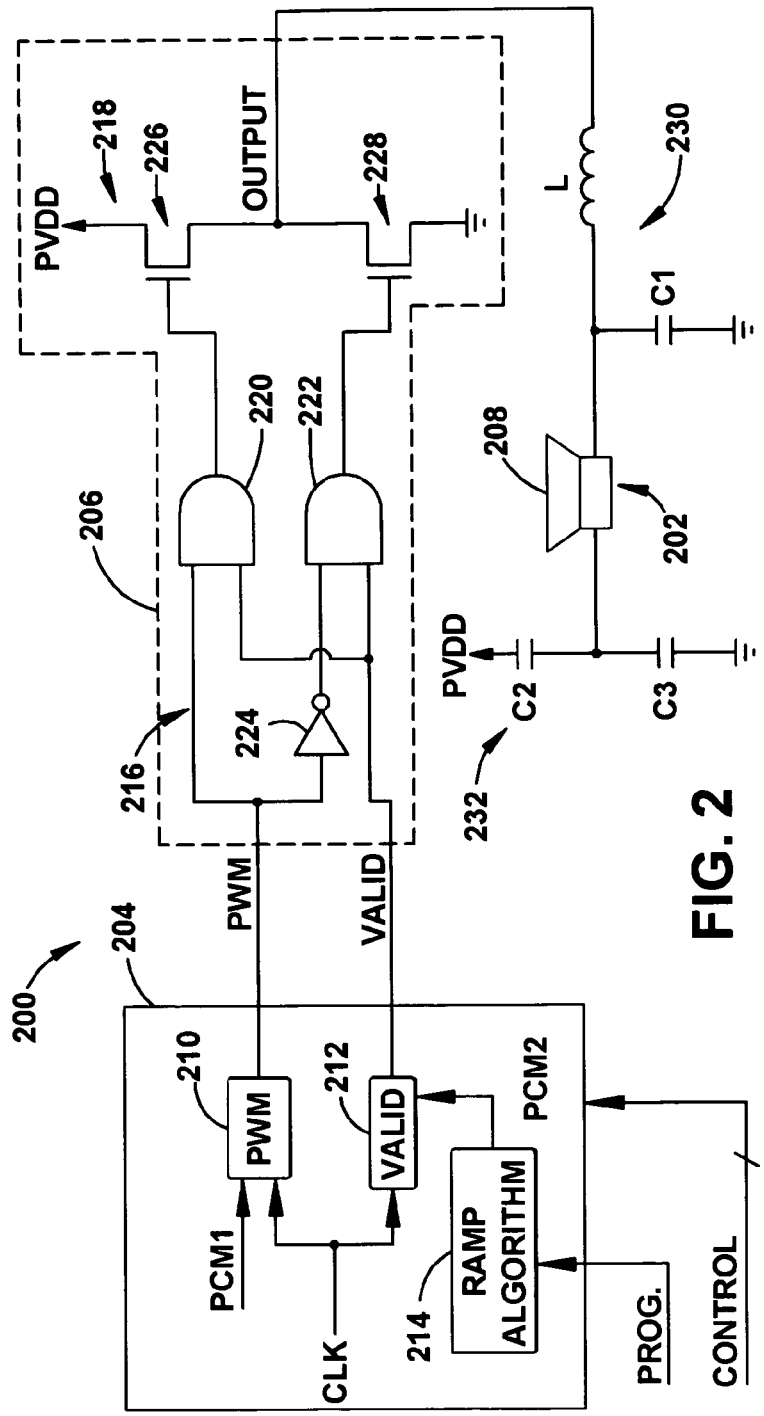
FIG. 2 illustrates another example of an audio system in accordance with an aspect of the invention.

FIG. 2 illustrates an example an audio system 200 that can be implemented to reduce offset across a load 202 in accordance with an aspect of the present invention. A modulation system 204 controls an output stage 206 that is connected to drive the load 202 with an output (OUTPUT) signal based on control information from the modulation system. For purposes of the following example, the output stage 206 corresponds to a switch-mode (or class D) audio amplifier associated with a respective audio channel, and the load includes one or more speakers 208. The load 202 is depicted as a single speaker 208, although more than one loudspeaker may be driven by the OUTPUT signal, and other associated circuitry can be considered in combination with the speaker as being the load. It is also to be understood that the audio system 200 can include more than one audio channel, each of which can be controlled to mitigate audible artifacts (e.g., click/pop) based on the teachings contained herein.

In the example of FIG. 2, the modulation system 204 supplies a pair of modulated output signals, indicated at PWM and VALID, to the output stage 206. The modulation system 204 controls the PWM and VALID signals based on one or more CONTROL signals. The one or more CONTROL signals, for example, can correspond to configuration instructions that define a modulation sequence that is associated with a mode change (e.g., start-up for the output stage 206). The one or more CONTROL signals can also include control information that determines whether the output stage is activated or deactivated or whether is to be shutdown. Those skilled in the art will understand and appreciate other types of information and instructions that can be utilized as part of the one or more CONTROL signals provided to the modulation system 204 in the context of an audio system.

The modulation system 204 includes a PWM block 210 that provides the PWM signal in response to a pulse-code-modulated (PCM1) input signal. That is, the PWM block can correspond to a PCM-to-PWM converter that generates the PWM signal based on the PCM1 input signal and a clock (CLK) signal. The PCM1 input signal can vary to control the duty cycle of the PWM signal, which can be fixed or variable depending on the operating mode of the modulation system 204. For instance, the PCM1 input signal can encode audio data during the normal operating mode of the audio system 200. Those skilled in the art will understand and appreciate various types and configurations of PCM-to-PWM converters that could be implemented in the modulation system 204.

The modulation system 204 includes a VALID block 212, such as including a PCM-to-PWM converter. The VALID block 212 provides the VALID output signal in response to another pulse-code-modulated (PCM2) signal. The PCM2 signal can also be fixed or variable depending on the operating mode of the modulation system 204. For example, the PCM2 signal can vary during a start-up sequence so that the pulse width of the VALID signal also varies during the start-up sequence to mitigate audible artifacts from the speaker. As mentioned herein, the start-up sequence is referred to as a Mid-Z sequence, which occurs during the Mid-Z mode. After the start-up sequence has completed, the PCM2 signal can be a fixed value for a subsequent phase (e.g., the normal operating mode), such that the corresponding pulse width of the VALID signal is also substantially fixed (e.g., a static high under normal operation).

By way of further example, a ramp algorithm 214 can be programmed and/or configured to provide the PCM2 signal to achieve the desired Mid-Z sequence during start-up. The ramp algorithm 214 can be implemented as hardware, software, or as a combination of hardware and software. For instance, the ramp algorithm 214 may include a shift register and counter circuit that operate to increment (or decrement) the PCM2 signal from a first (or starting) value to a second (or ending) value. The value of the shift register can be updated once per PWM frame, such that the counter value (corresponding to the value of PCM2 signal) increments or decrements when the shift register contains a predetermined value (e.g., all logic ones). Thus PCM2 signal can be updated at uniform intervals or non-uniform intervals depending on how the shift register is loaded and what criteria is used to cause the counter to be updated. The operation of the ramp algorithm 214 may be programmable via a PROG input (e.g., by setting the starting and ending values of the PCM2 signal and how the PCM2 signal is incremented). The program information can be stored in a register or other memory device.

The output stage 206 employs the PWM and VALID signals to control the OUTPUT signal. In the example of FIG. 2, the output stage 206 includes a logic drive network 216 that provides modulated gate drive signals to a half-bridge 218. For example, the logic drive network 216 can decode the PWM and VALID signals to generate gate drive signals, control the half-bridge as well as correct timing asymmetry that other blocks in the PWM signal path might cause. The logic drive network 216 may include a pair of AND-gates 220 and 222. The first AND-gate 220 ANDs the PWM signal with the VALID signal to provide a corresponding high-side drive signal to an output transistor 226. An inverter 224 inverts the PWM signal, which the second AND-gate 222 ANDs with VALID signal to provide a corresponding low-side drive signal to another output transistor 228. The output transistors 226 and 228 are arranged as a half-bridge 218 connected between high and low voltage rails (e.g., PVDD and electrical ground, respectively). In the example implementation of FIG. 2, each of the output transistors 226 and 228 are the same type of transistor (e.g., PMOS transistors or NMOS transistors), although different types of transistors could be used in other implementations. Thus, the OUTPUT signal modulates between PVDD and electrical ground according to the gate drive signals, which further vary as a function of the PWM and VALID signals. By way of further example, when the transistors 226 and 228 are switching, the average voltage of the OUTPUT signal is determined by relative the on-time versus off-time of the transistors 226 and 228.

In the example of FIG. 1, a filter 230 is connected between the load 202 and the output stage 206 and the load. The filter 230 is depicted as including an inductor L and a capacitor C1. The filter 230, for example, can be implemented to provide a second order low-pass filter that can remove high-frequency noise (e.g., switching noise). The filter 230 further may include series resistance from the inductor L as well as parasitic capacitance associated with the half-bridge 218 (both not shown for sake of simplicity). A DC blocking element 232 is also connected to the speaker. In the example of FIG. 2, the DC blocking element 232 is implemented as a split capacitor network that includes a first capacitor C2 connected in series with a second capacitor C3 between the high and low voltage rails (e.g., between PVDD and electrical ground, respectively). The juncture between the capacitors corresponds to a mid-point node that is connected with the speaker 208.

As mentioned above, the modulation system 204 controls the PWM and VALID signals according to the operating mode of the system 200. By way of example, a start-up (or Mid-Z) mode can be implemented at a transition from a non-switching mode for the output stage 206 to a switching mode. During the start-up mode, the modulation system 204 provides the PWM and VALID signals to implement a Mid-Z or start-up sequence so as to gradually charge the DC blocking element 232 (e.g., the mid-point node of the split-capacitor) to a desired level. Since the output stage 206 charges the DC blocking element 232 through the speaker 208, the modulation system 204 controls the output stage during the Mid-Z sequence to charge the DC blocking element so as to mitigate audible artifacts, such as click/pop, from the speaker 208.

For example, a gradual charging of the DC blocking element 232 can be achieved by varying the modulation of the VALID signal while the modulation of the PWM signal is substantially fixed (e.g. a 50% duty cycle). Alternatively, the Mid-Z sequence may be implemented by varying modulation of both the PWM and VALID signals. Since the Mid-Z sequence employs the same circuitry as the normal operating mode, which occurs after the Mid-Z sequence is complete, the effects of parasitics and process variations can be reduced relative to various conventional approaches.

Figure 3:
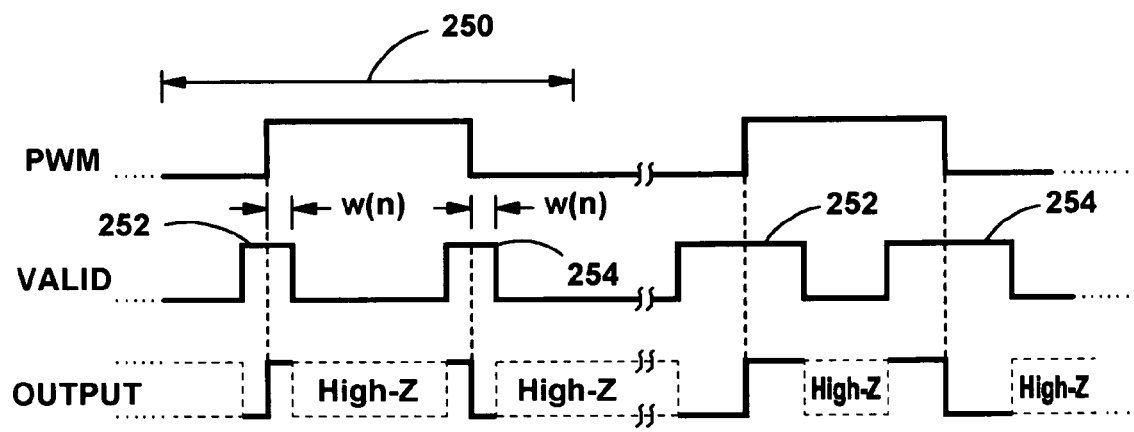
FIG. 3 is a timing diagram depicting an example of signals in an audio system implemented in accordance with an aspect of the invention.
Figure 4:
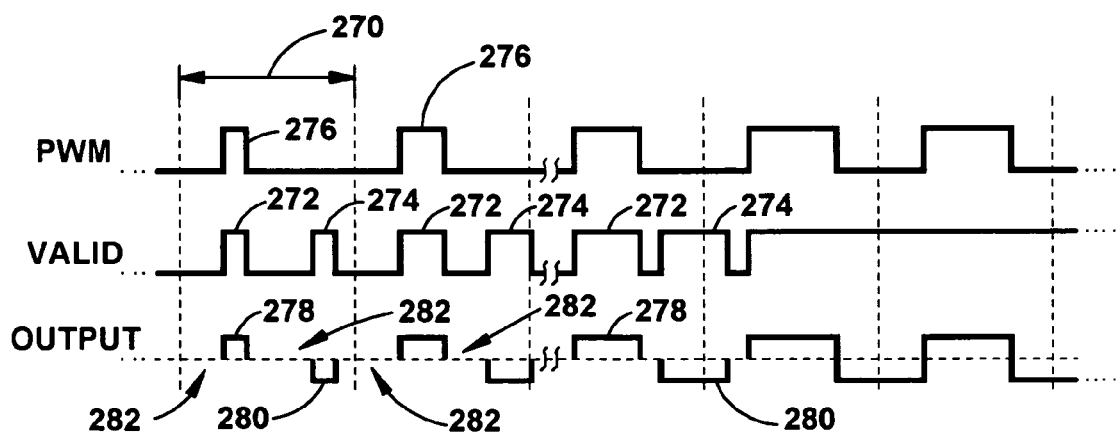
FIG. 4 is a timing diagram depicting another example of signals in an audio system implemented in accordance with an aspect of the invention.

Two examples of modulation schemes for implementing the Mid-Z sequence with respect to the circuit arrangement of FIG. 2 will be better appreciated with reference to FIGS. 3 and 4. The relative pulse widths depicted in FIGS. 3 and 4 are qualitative for purposes of simplicity of describing the different approaches, and are not to be considered limiting of such approaches. Those skilled in the art will understand and appreciate that the examples of FIGS. 3 and 4 correspond to two examples of many possible approaches that could be utilized to precharge a DC blocking element according to an aspect of the present invention.

FIG. 3 depicts a modulation scheme illustrating the PWM signal, the VALID signal and the OUTPUT signal (from the half-bridge 218 of FIG. 2) for a first example of a Mid-Z sequence. In FIG. 3, the PWM signal has a substantially fixed duty cycle (e.g., approximately 50% duty cycle). The drive logic 216 (FIG. 2) thus generates gate drive signals based on the PWM and VALID signals to provide the OUTPUT signal. For instance, the OUTPUT signal operates in a High-Z mode when the VALID signal is low, corresponding to a non-switching mode of the half-bridge 218 (FIG. 2). The OUTPUT signal operates in a corresponding Low-Z mode when the VALID signal is high, corresponding to a switching mode of the half-bridge 218 (FIG. 2). The relative on-time versus off-time during the Low-Z mode corresponds to approximately 50% duty cycle (e.g., the OUTPUT signal is high for about ½ the Low-Z mode).

In the example of FIG. 3, the VALID signal includes a pulse for each transition (low-to-high and high-to-low) of the PWM signal. Thus, for a given period 250 of the PWM signal (corresponding to a PWM frame), the VALID signal includes two pulses, each having a predetermined relationship relative to the PWM signal. For example, a first pulse 252 of the VALID signal for a given frame is symmetric relative to (e.g., centered about) a low-to-high edge transition of the PWM signal and a second pulse 254 in the given frame is symmetric relative to (e.g., centered about) a high-to-low edge transition of the PWM signal. The VALID signal further can be modulated during the Mid-Z sequence so that subsequent pulses have the same relationship relative to the edge transitions of the PWM signal. For instance, the VALID signal can be modulated so that the width of the pulses 525 and 254 increases in subsequent PWM frames during the Mid-Z sequence, such as until the VALID signal remains asserted continuously. When the VALID signal remains asserted continuously corresponds to the end of the Mid-Z sequence, and the OUTPUT signal can have a 50% duty cycle (assuming the absence of audio content).

The manner in which the pulse width of the VALID signal is incremented in different frames determines the duration of the entire Mid-Z sequence. It is not required that the width of the VALID signal pulses 252 and 254 are increased every frame during the Mid-Z sequence. As mentioned above, the pulse width can be increased by implementing pulse-coded-modulation that provides a value that varies during the Mid-Z sequence. In one example, the pulse width can be uniformly incremented each PWM frame of the Mid-Z sequence. The step frequency at which the pulse width is incremented further can be controlled so that the fundamental frequency of the changes in the OUTPUT signal are outside the audio band. For example, a duration greater than about 100 milliseconds (e.g., greater than or equal to about 300 milliseconds) should be sufficient duration to perform the Mid-Z sequence to mitigate audible artifacts from being injected into the Mid-Z sequence. As a result, an average of the OUTPUT signal can ramp gradually up to the desired level to charge the DC blocking element without introducing audible artifacts.

FIG. 4 depicts an example of a Mid-Z sequence modulation scheme where both the PWM signal and the VALID signal exhibit varying modulation to gradually ramp the OUTPUT signal up to the desired level (e.g., corresponding to a 50% duty cycle). The period 270 of a given PWM frame is fixed during the Mid-Z sequence. The pulse width of the PWM pulse increases over a series of PWM frames until a predetermined duty cycle is achieved for the PWM signal. The pulse width of the VALID signal is also increased over a series of sequential PWM frames. The increase in pulse width of the VALID signal may be the same as the increase in pulse width for the PWM signal. The pulse width of the PWM and VALID signals can incrementally increase until the VALID signal remains continuously asserted, which defines the end of the Mid-Z sequence. At the end of the Mid-Z sequence, the PWM signal can be provided at a 50% duty cycle, which results in the OUTPUT signal having about a 50% duty cycle (assuming the absence of audio content).

In the example of FIG. 4, the VALID signal includes two pulses 272 and 274 in a given PWM frame, each of the VALID pulses having a predetermined relationship relative to the PWM signal 276 in such frame. For example, the VALID signal includes a first pulse 272 that is substantially commensurate (e.g., in both duration and alignment) with the assertion of the PWM pulse 276. The second pulse 274 of the VALID signal is symmetric with the de-asserted portion (low-time) of the PWM signal, although having the same duration as the first pulse of the VALID signal for the given PWM frame. That is, the second pulse 274 is centered relative to the low-time of the PWM signal for each PWM frame.

The assertion of the VALID signal during a given PWM frame results in the OUTPUT signal having two pulses, indicated at 278 and 280, for each respective frame, each pulse corresponding to a respective one of the valid pulses 272 and 274 for each respective PWM frame. That is, when the half-bridge 216 (FIG. 2) is switching during the Mid-Z sequence, the OUTPUT signal exhibits a pulse 278 or 280 corresponding to the Low-Z mode. The relative on-time and off-time during the Low-Z mode (provided by pulses 278 and 280) can correspond to approximately 50% duty cycle (e.g., the OUTPUT signal is high for about ½ the Low-Z mode of a given PWM frame). Between each pulse 278 and 280 of the OUTPUT signal during the Mid-Z sequence, the OUTPUT signal operates in the High-Z mode, as indicated at 282, which corresponds to a non-switching mode of the half-bridge 216 (FIG. 2) when both FETs are turned off.

Figure 5:
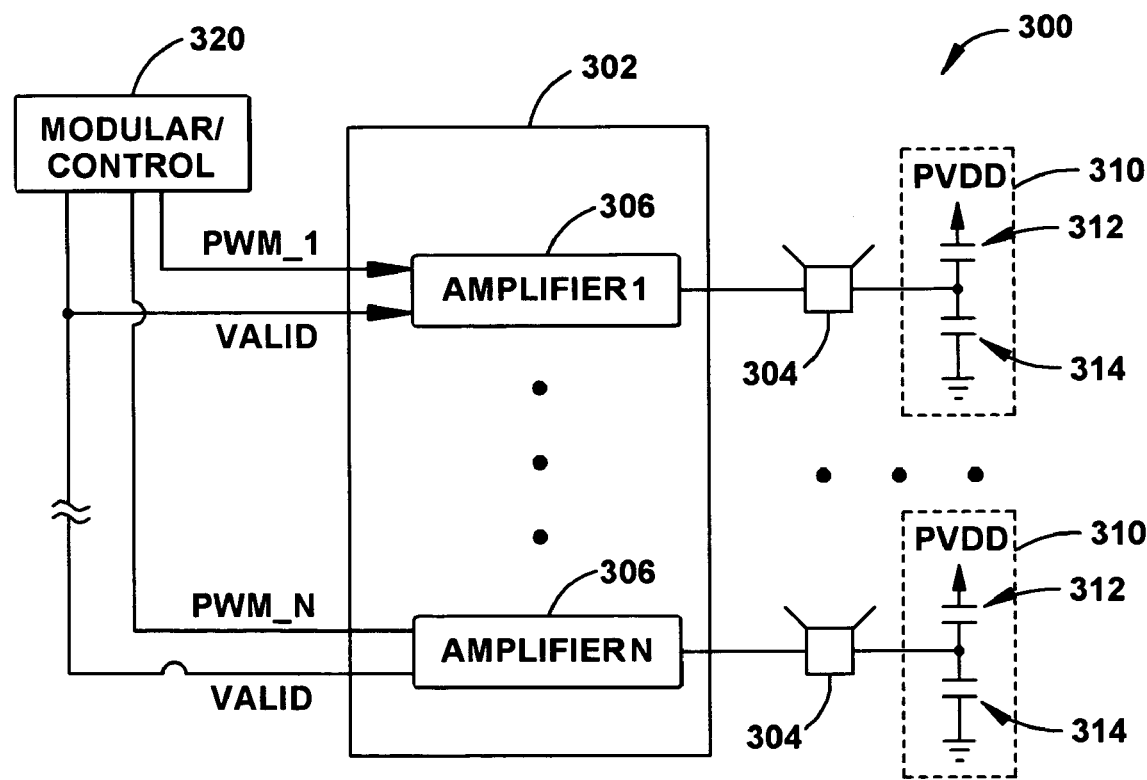
FIG. 5 illustrates an example of a multi-channel audio system in accordance with an aspect of the invention.

FIG. 5 illustrates an example of part of a multi-channel audio system 300 that can be implemented in accordance with an aspect of the invention. For example, the multi-channel audio system 300 can correspond to a surround sound audio system. In the example of FIG. 5, the audio system 300 is configured in multi-channel single-ended output configuration, although the present invention is equally applicable to other modes, such as a bridge tied load output configuration.

The audio system 300 includes an amplifier system 302 that is operative to provide multi-channel amplified audio signals to a plurality of loads, namely loud speakers 304. The amplifier system 302 includes an associated power amplifier 306 that provides amplified audio for each audio channel, represented as AMPLIFIER 1 through AMPLIFIER N, where N is a positive integer greater than 1 denoting the number of audio channels. For example, each of the amplifiers 306 can be implemented as a class D (or switch mode) amplifier, although other classes of amplifiers may be used. The amplifier system 302 may be fabricated on a single IC chip.

DC blocking elements 310 are employed in series with the speakers to facilitate channel separation. In the example of FIG. 5, the DC blocking elements 310 are implemented as respective split-cap decoupling components for each of the output channels. The split-cap decoupling components include first and second capacitors 312 and 314 connected between PVDD and electrical ground, with the mid-point of each split cap connected to the respective speaker 304. It is to be appreciated that other types of DC blocking elements (e.g., capacitive and/or resistive) can be utilized from the split-capacitor arrangement depicted in FIG. 5.

A modulator/control system 320 controls the amplifier system 302 according to an aspect of the present invention. The modulator/control system 320 can control the amplifier in a plurality (e.g., two or more) operating modes, which can includes a start-up mode and a normal operating mode. The start-up mode can be utilized during a transition from a non-switching mode to a switching mode for one or more of the amplifiers 306. The transition from a non-switching mode to a switching mode can occur, for example, at power-up for the system 300, when a master clock to the modulator/control system 320 has been lost, if a mute function has been enabled in the control system, or it can occur during a transition between different active amplifier modes (e.g., from a stereo mode to a surround sound mode) to name a few.

The modulator/control system 320 can provide one or more control signals to each of the amplifiers 306, which signals can include a PWM signal and a VALID signal. In the example of FIG. 5, the modulator/control system 320 provides separate PWM signals (indicated at PWM_1 through PWM_N) to each of the respective amplifiers 306 along with a common VALID signal. It is to be understood that, alternatively, separate VALID signals can be provided to one or more (e.g., suitably to each) of the respective amplifiers 306 to achieve a greater degree of control during the start-up mode.

In the start-up mode, the modulator/control system 320 can actively control modulation of one or both of the PWM and VALID signals, such as described herein (see, e.g., FIGS. 3 and 4). The PWM and VALID signals thus are provided, according to a Mid-Z sequence, for precharging the DC blocking elements 310 with a properly shaped energy spectrum. The PWM and VALID signals cooperate to provide a Mid-Z sequence that gradually charges the DC blocking element 310 associated with each channel to a predetermined voltage (e.g., a mid-point voltage, such as to PVDD/2). By implementing such precharging prior to implementing a continuous switching (or Low-Z) mode when the power amplifiers 306 are activated, audible artifacts (click/pop) can be reduced or eliminated from the speakers 304.

Figure 6:
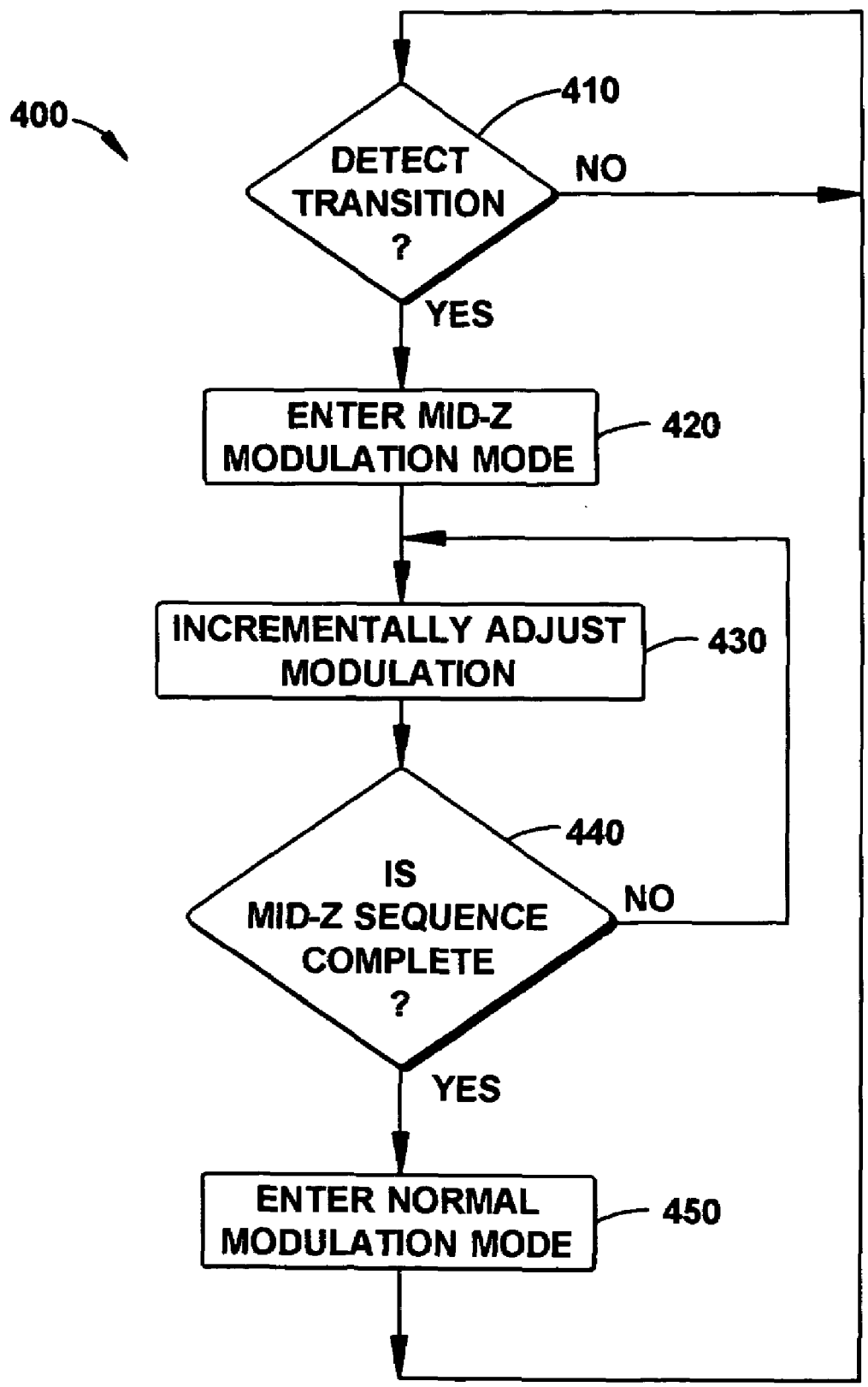
FIG. 6 illustrates a flow diagram of a method that can be utilized to control power delivered to a load in accordance with an aspect of the invention.

In view of the foregoing structural and functional features described above, certain methods will be better appreciated with reference to FIG. 6. It is to be understood and appreciated that the illustrated actions, in other embodiments, may occur in different orders and/or concurrently with other actions. Moreover, not all illustrated features may be required to implement a method. It is to be further understood that the following methodology can be implemented in hardware (e.g., analog or digital circuitry, such as may be embodied in an application specific integrated circuit or chipset), software (e.g., as executable instructions stored on a computer readable media or running on a processor), or any combination of hardware and software.

FIG. 6 illustrates a flow diagram of a method 400 that can be utilized to control power delivered to one or more loads, such as speakers, in accordance with an aspect of the invention. For example, the method 400 can be implemented by an audio system that includes an amplifier system, such as for providing single or multi-channel audio. The method further can be implemented by circuitry of a PWM system, such as a PWM processor.

At 410, a determination is made as to whether a mode transition has been detected, such as might result in a DC offset occurring across one or more speakers. A mode transition can be detected in a variety of circumstances, including, for example, at power-up for the system 300, when a master clock to the modulator/control system 320 has been lost, if a mute function has been enabled in the control system, or it can occur during a transition between different active amplifier modes (e.g., from a stereo mode to a surround sound mode) to name a few. If a transition is detected (YES), the method proceeds to 420, else the method can loop at 410 until a transition is detected.

At 420, a Mid-Z modulation mode is entered. The Mid-Z modulation mode can correspond to a situation where an output amplifier stage (e.g., including a half-bridge or other circuit) provides an output impedance that varies between a low-impedance (e.g., one or more switch devices in a conductive state) and a high-impedance condition (e.g., all switch devices activated to a non-conductive state). At 430, modulation of the amplifier output stage is adjusted incre-mentally. The incremental adjustment, for instance, can result in a corresponding increase in the output signal, such as for charging a DC blocking element that is coupled to the amplifier output stage. The DC blocking element can be coupled to the amplifier output stage through a one or more speakers as well as other circuitry (e.g., a low pass filter).

At 440, a determination is made as to whether or not the Mid-Z sequence is complete. The determination can include, for example, determining whether a predetermined modulation sequence has been implemented or determining whether the DC blocking element has reached a predetermined voltage that will mitigate DC offset when normal operation of the amplifier output stage begins to supply power to the one or more speakers. If the Mid-Z sequence is not complete (NO), the method returns to 430 to continue the Mid-Z sequence and incrementally adjust the modulation. However, if the Mid-Z sequence is complete (YES), then the method proceeds from 430 to 450. At 450, a normal modulation mode begins, such as by providing a common mode output voltage (e.g., a mid-point voltage) to the one or more associated speakers. The supply of power may or may not include audio. For example, when no audio is provided, the normal mode can provide a PWM output signal having approximately a 50% duty cycle. The duration and other parameters of the Mid-Z modulation scheme further may be programmable, such depending on application requirements.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. An audio system comprising:
    a switch mode amplifier that provides an output signal at an output for driving a load based on at least one control signal; and
    a control system that provides the at least one control signal to control the amplifier according to an operating mode of the audio system, in a first mode, the control system providing the at least one control signal to actively control an equivalent output impedance at the output of the amplifier, gradually adjusting the equivalent output impedance from a high-impedance state to a low impedance state, so as to mitigate a voltage drop across the load when the amplifier is activated to a second mode corresponding to the low impedance state.

2. The system of claim 1, wherein the control system further comprises:
    a first modulator that provides a first pulse-width-modulated (PWM) signal that alternates between high and low logic levels every PWM frame; and
    a second modulator that provides a valid PWM signal that alternates between high and low logic levels every PWM frame, the valid PWM signal having a pulse width each PWM frame that gradually increases from a first pulse width at the beginning of the first mode to a second pulse width at the end of the first mode, the second pulse width being greater than the first width, such that the low impedance state can be provided at the output of the amplifier during the second mode.

3. The system of claim 2, wherein the control system further comprises a pulse code modulation (PCM) control block that provides a PCM output signal to the second modulator, the PCM output signal varying to control the pulse width during the first mode.

4. The system of claim 2, wherein each of the valid PWM signal pulses has a predetermined timing relationship relative to a respective portion of the first PWM signal during each frame.

5. The system of claim 4, wherein each valid PWM pulse is substantially symmetrical relative to an edge transition in the first PWM signal during the first mode.

6. The system of claim 4, wherein a first pulse of the valid PWM signal is substantially centered with the high logic level of the first PWM signal in a given PWM frame, and a second pulse of the valid PWM signal is substantially centered with the low logic level of the first PWM signal in the given frame.

7. The system of claim 6, wherein the valid PWM signal remains continuously asserted at an end of the first mode and during the second mode.

8. The system of claim 1, wherein the at least one control signal comprises first and second pulse-width-modulated (PWM) control signals, the control system controlling at least one of the first and second modulated control signals to exhibit a modulation scheme that varies a pulse width over a plurality of PWM frames thereof during the first mode, such that the low impedance state can be provided at the output of the amplifier during the second mode.

9. The system of claim 1, further comprising a DC blocking element coupled to said load.

10. The system of claim 1, wherein the load comprises at least one speaker, whereby audible artifacts provided by the at least one speaker are mitigated when the amplifier switches to operate in the second mode.

11. The amplifier system of claim 1, further comprising:
a plurality of switch mode amplifiers, each of the plurality of amplifiers providing an amplified output signal at an output thereof for driving a respective load based on a corresponding control signal; and
a plurality of DC blocking elements, each of the plurality of DC blocking elements being coupled with a respective load, the control system controlling each of the plurality of amplifiers to gradually adjust an output impedance at the respective outputs of the plurality of amplifiers during the first mode for charging each of the plurality of DC blocking elements to a predetermined level during the first mode so as to mitigate a voltage drop across each respective load when each of the system switches from the first mode to the second mode.

12. The amplifier system of claim 11, wherein each of the plurality of loads comprises at least one speaker associated with each power amplifier.

13. A modulation system for an audio amplifier comprising:
means for providing at least one modulated signal to provide audio power to at least one speaker; and
means for controlling the means for providing in a first mode such that the at least one modulated signal has a modulation that varies incrementally between a starting modulation and an ending modulation according to a modulation sequence; and
means for controlling the means for providing in a second mode, following the first mode, such that, in the absence of audio the at least one modulated signal has a substantially fixed modulation, whereby audible artifacts provided by the at least one speaker are mitigated when the second mode begins.

14. The system of claim 13, wherein the at least one modulated signal further comprises a first modulated signal and a second modulated signal, the second modulated signal includes at least one pulse more than the first modulation signal for at least a portion of modulation frames of the first modulated signal during the first mode, and at least the second modulated signal has a modulation sequence that varies during the first mode.

15. The system of claim 14, wherein a first of the at least two pulses of the second modulated signal is substantially symmetric relative to a first portion of the first modulated signal in each modulation frame during the first mode, and a second of the at least two pulses of the second modulated signal is substantially symmetric relative to a second portion of the first modulated signal in each modulation frame during the first mode.

16. The system of claim 15, wherein, during each modulation frame, the first and second portions of the first modulated signal comprise at least one of (i) a respective edge transition of the first modulated signal or (ii) an on-time and an off-time, respectively, of the first modulated signal.

17. The system of claim 13 in combination with an audio system, the combination further comprising:
means for providing an amplified audio output signal based on the at least one modulated signal, the amplified audio signal charging a DC blocking element through the at least one speaker during the first mode so that audible artifacts from the speaker are mitigated when changing from the first mode to the second mode.

18. A method for controlling an audio amplifier to mitigate audible artifacts, the method comprising:
entering a first modulation mode in response to detecting a transition from a non-switching mode to a switching mode;
incrementally adjusting modulation of at least one modulated control signal during the first modulation mode; and
providing an output signal that gradually charges a DC blocking element to a predetermined level during the first modulation mode based on the at least one modulated control signal.

19. The method of claim 18, wherein the at least one modulated control signal comprises first and second modulated control signals having a predetermined relationship to each other each modulation frame during the first modulation mode, at least the second modulated control signal having variable modulation during the first modulation mode, the output signal being provided as a function of the first and second modulated control signals.

20. The method of claim 18, wherein the at least one modulated control signal comprises first and second modulated control signals that have a predetermined relationship to each other each modulation frame during the first modulation mode, each of the first and second modulated control signals exhibiting an increasing pulse width over a plurality of modulation frames during the first modulation mode until the second modulated control signal reaches a substantially continuous level.

* * * * *